United States Patent [19]

Malhi

[11] Patent Number: 5,338,965
[45] Date of Patent: Aug. 16, 1994

[54] HIGH VOLTAGE STRUCTURES WITH OXIDE ISOLATED SOURCE AND RESURF DRIFT REGION IN BULK SILICON

[75] Inventor: Satwinder Malhi, Garland, Tex.

[73] Assignee: Texas Instruments Incorporated, Dallas, Tex.

[21] Appl. No.: 53,028

[22] Filed: Apr. 26, 1993

Related U.S. Application Data

[62] Division of Ser. No. 857,875, Mar. 26, 1992, abandoned.

[51] Int. Cl.$^5$ .................. H01L 27/01; H01L 27/23; H01L 29/68; H01L 29/78
[52] U.S. Cl. .................. 257/492; 257/339; 257/343; 257/347; 257/629; 257/630
[58] Field of Search ............... 257/335, 336, 339, 343, 257/347, 348, 492, 493, 496, 487, 488, 491, 629, 630

[56] References Cited

U.S. PATENT DOCUMENTS 4,763,183 8/1988 Ng et al. ............... 257/347
4,786,952 11/1988 MacIver et al. ............ 257/348
5,113,236 5/1992 Arnold et al. .............. 257/492

OTHER PUBLICATIONS

J. A. Appels et al., "High voltage thin layer devices (Resurf Devices)" *IEDM Tech. Digest* (Dec. 1979) pp. 238–242.
H. W. Lam, "Silicon-On-Insulator-Epitaxy" in: *Epitaxial Silicon Technology*, New York, Academic Press (1986) pp. 269–321.
Ratnham, et al., "High Voltage Silicon-on-Insulator (SOI) MOSFETs", *3rd International Symposium on Power Semiconductor Devices and ICs*, pp. 36–39, 1991.

*Primary Examiner*—J. Carroll
*Attorney, Agent, or Firm*—Ronald O. Neerings; James C. Kesterson; Richard L. Donaldson

[57] ABSTRACT

An integrated circuit RESURF LDMOS power transistor combines SOI MOS technology with RESURF LDMOS technology to provide a source isolated high voltage power transistor with low "on" resistance for use in applications requiring electrical isolation between the source and substrate.

15 Claims, 2 Drawing Sheets

HIGH VOLTAGE STRUCTURES WITH OXIDE ISOLATED SOURCE AND RESURF DRIFT REGION IN BULK SILICON

This is a division of application Ser. No. 07/857,875, filed Mar. 26, 1992 abandoned.

FIELD OF THE INVENTION

This invention is in the field of semiconductor integrated circuits and relates primarily to high power devices.

BACKGROUND OF THE INVENTION

In the field of power integrated much work has been done in the development of power transistors. Advancements were made enabling LDMOS power transistors (lateral double diffused MOS transistor) to exhibit low "on-resistance" (RDSon) and high breakdown capability concurrently through a reduced surface field (RESURF) technique (J. A. Appels and H. M. J. Vaes, "High Voltage Thin Layer Devices (RESURF Devices)", *IEDM Tech. Digest*, pp. 238–241, 1979).

In the past, RESURF LDMOS transistors commonly were used in low side driver applications because the transistor structure coupled the source to the substrate which in turn was coupled to ground. (A low side driver configuration consists of the source of the LDMOS transistor coupled to ground and the drain coupled to an output load.) Therefore, RESURF LDMOS transistors were not utilized in high side driver applications and other applications that mandated electrical isolation between the source and substrate. (A high side driver configuration consists of the drain of the LDMOS transistor coupled to circuitry or a power supply and the source coupled to an output load.)

It is an object of this invention to provide a high power integrated circuit device with electrical isolation between source and substrate. It is another object of this invention to provide a LDMOS transistor with an isolated source and RESURF drift region. Other objects and advantages of the invention will become apparent to those of ordinary skill in the art having reference to the following specification together with the drawings herein.

SUMMARY OF THE INVENTION

An integrated circuit RESURF (REduced SURface Field) LDMOS (Lateral Double-diffused MOS) power transistor combines SOI (Silicon-On-Insulator) MOS technology with RESURF LDMOS technology. A SOI transistor and a RESURF drain region are coupled together on the same substrate to provide a source isolated high voltage power transistor with low "on" resistance. This allows the RESURF LDMOS transistor to be advantageously used in applications requiring electrical isolation between the source and substrate.

DETAILED DESCRIPTION OF THE PREFERRED EMBODIMENT

Figure 1:
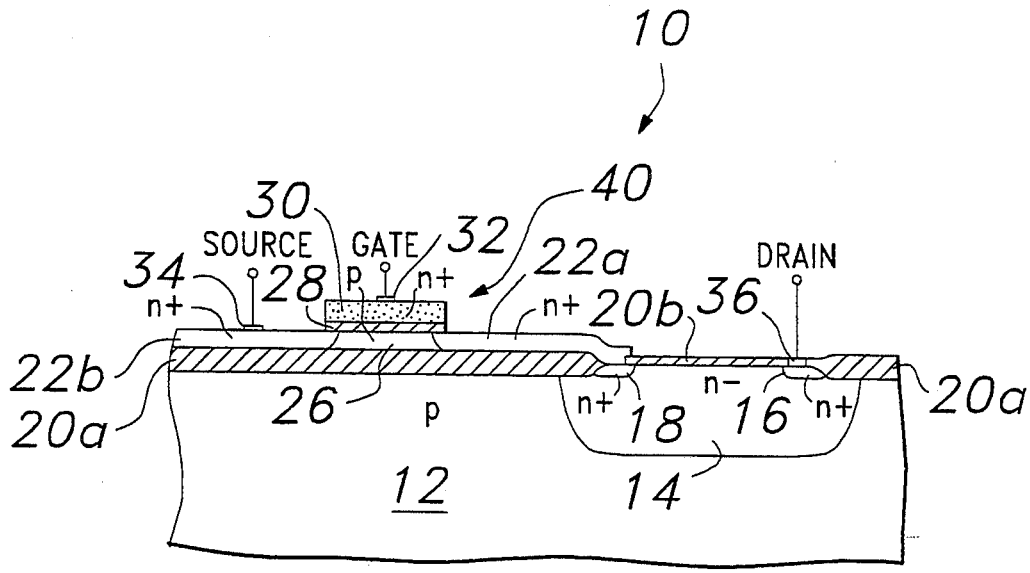
FIG. 1 is a cross section drawing illustrating the preferred embodiment of the invention.

FIG. 1 is a cross section drawing illustrating the preferred embodiment of the invention. A RESURF LDMOS transistor 10 has a P type substrate 12. A patterned oxide layer 20a is formed over the face of the substrate 12 using a standard LOCOS process with an opening provided for an implant. An implant forms an N− type drain drift region 14 in the P type substrate 12. A patterned oxide layer 20b is formed over the drain drift region 14 with an opening separating the thick oxide 20a overlying the substrate 12 and the thin oxide 20b overlying the drain drift region 14. A P type doped polysilicon layer 26 is formed over the transistor 10 and forms the channel 26 of the transistor 10. The P type polysilicon layer 26 is etched to remove the polysilicon lying over the thin oxide 20b. An oxide 28 is formed over the transistor 10 and becomes the gate oxide 28. A second polysilicon layer 30 of N+ type doping is formed over the oxide 28, becoming the poly gate 30. An etch removes most of poly layer 30 leaving a portion overlying the P type polysilicon channel layer 26 and the P type substrate 12. A patterned N+ type implant dopes the P type polysilicon layer 26 in areas not lying underneath the poly gate 30 and drain region 16. The N+ type dopant is also driven in from poly 22a to form region 18 in the drain draft region 14. This process step forms an N+ type drain interconnect 22a which connects the drain drift region 14 through contact diffusion 18 to the channel 26 and an N+ type source 22b formed on the other side of the poly channel 26. A patterned oxide layer (not shown in FIG. 1) is formed over the transistor 10 with holes opened for the formation of metal contacts. A patterned metal layer is formed over the transistor 10 forming a source contact 34, a gate contact 32, and a drain contact 36.

Referring to FIG. 1 it can be seen that a silicon-on-insulator, SOI, NMOS transistor 40 exists on top of the first insulating layer 20a comprising the source 22b, the channel 26, and the drain interconnect 22a. The article of Lam, Hon Wai; Baliga, Jayant B. ed., entitled "Silicon-on-Insulator Epitaxy" in: Epitaxial Silicon Technology (New York, Academic Press, Inc., 1986), pp. 269–321 describes SOI technology. The drain drift region 14 works to provide a RESURF function in the LDMOS transistor 10. Incorporation of SOI and RESURF technology advantageously provides a RESURF LDMOS power transistor 10 that has the breakdown and RDSon performance of a RESURF LDMOS transistor with its source 22b electrically isolated from the substrate 12, thus increasing the RESURF LDMOS transistor's flexibility by allowing the device to be used in HSD applications (high side driver) as well as other applications that require electrical isolation between the source 22b and substrate 12.

Figure 4:
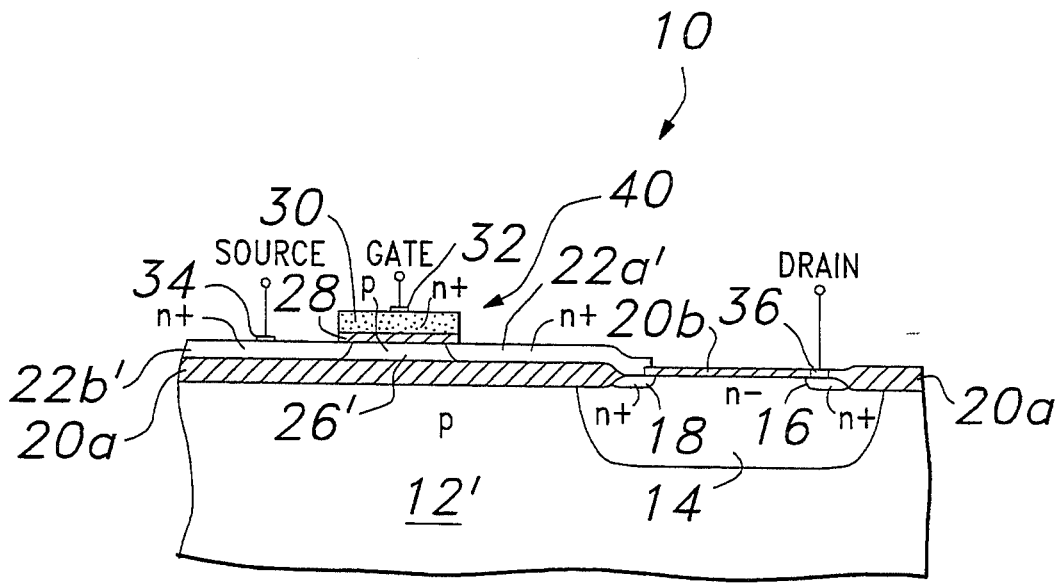
FIG. 4 is a cross section drawing illustrating another embodiment of the invention.
Figure 5:
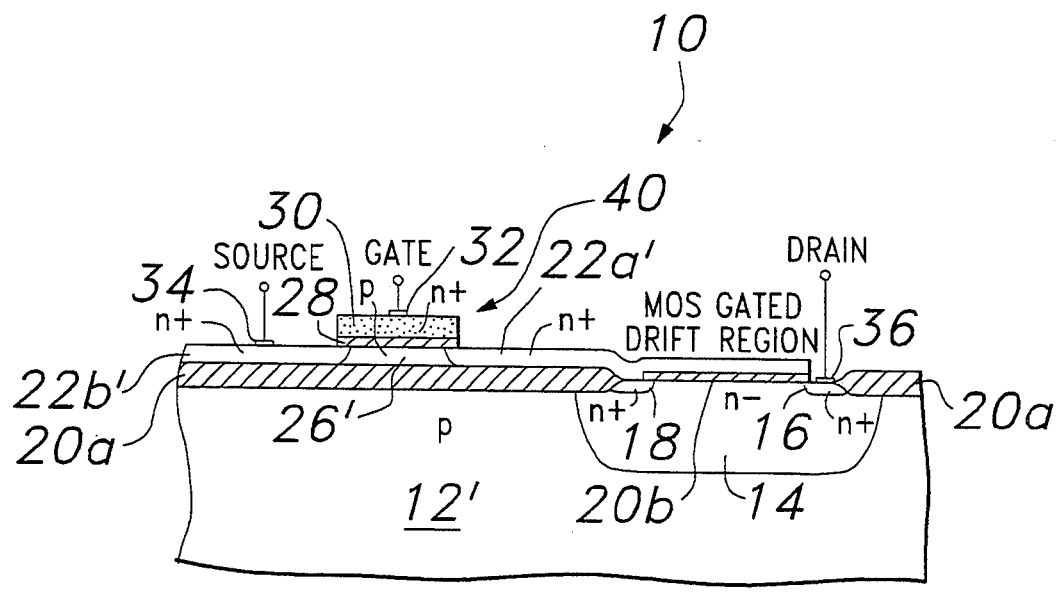
FIG. 5 is a cross section drawing illustrating yet another embodiment of the invention.

N+ and P type doped polysilicon is the preferred embodiment in forming the SOI NMOS transistor 40 over the first insulating layer 20a in FIG. 1. Polysilicon is used for manufacturability reasons since it is an easy task to form polysilicon over an insulator. Polysilicon is more resistive than single crystal silicon. To further reduce the RDSon (drain to source "on" resistance) of the RESURF LDMOS 10 the SOI NMOS transistor 40 may alternatively be formed using single crystal silicon, as shown in FIGS. 4 and 5. Source 22b', channel 26', drain interconnect 22a' and substrate 12' of FIGS. 4 and 5 are the single crystal silicon equivalents of polysilicon source 22b, channel 26, drain interconnect 22a and substrate 12 of FIGS. 1 and 2. Special processing techniques exist to form SOI transistors using single crystal silicon. Such techniques may include wafer bonding or SIMOX (Silicon isolation by IMplanted OXide) which are well known by those skilled in the art. The SOI NMOS transistor 40 composed of single crystal silicon is less resistive than polysilicon and therefore provides improved RDSon performance. The primary trade-off is cost versus performance since the poly method is easy and inexpensive while the single crystal alternative provides improved performance, but with increased cost.

The RESURF LDMOS transistor 10 of FIG. 1 operates in the following manner: when a positive voltage greater in magnitude than the device threshold voltage appears on the transistor gate 30 the channel 26 conducts and current flows from the drain contact 36 through the drain contact diffusion 16, through the drain drift region 14, through the second diffusion contact 18, through the polysilicon drain interconnect 22a, through the polysilicon channel 26, through the polysilicon source 22b, and finally through the source contact 34. When a voltage lower than the device threshold voltage appears on the transistor gate 30 the polysilicon channel 26 does not conduct and the transistor 10 behaves like an open circuit.

In electronic power systems transients on power supply lines are common. Power transistors connected to the supply lines are therefore rated to survive these transient conditions. RESURF LDMOS transistor 10 of FIG. 1 advantageously breaks down in a manner such that the power transistor's reliability is not compromised. During a power supply transient the drain contact 36 is coupled to the power supply and therefore the transient voltage appears on the drain contact 36. When a transient voltage appears at the drain contact 36 that exceeds the transistor 10 breakdown rating, the drift region 14 of the transistor 10 becomes fully depleted. (The breakdown voltage of a RESURF LDMOS transistor is a complex function of the drift region 14 length, depth, and doping concentration.) Most of the voltage drop occurs across the drain drift region 14 such that only 5-10 volts will drop across the SOI NMOS transistor. When the drain drift region has become fully depleted the junction between the drain drift region 14 and substrate 12 breaks down. Since the breakdown site is well within the bulk of substrate 12, no charge is injected into surface oxides 20a thereby prohibiting unstable or walking breakdown phenomena.

Figure 2:
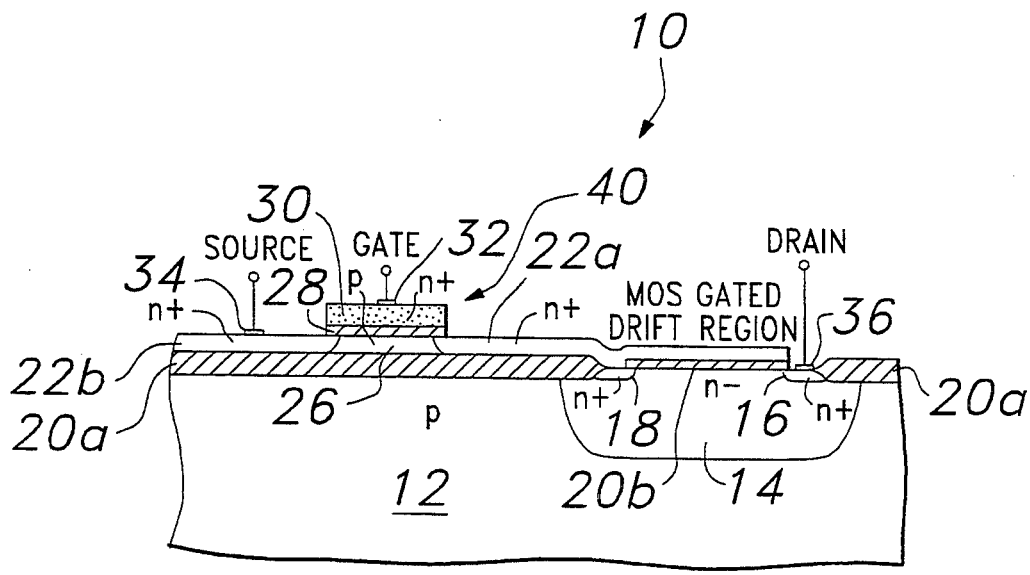
FIG. 2 is a cross section drawing illustrating an alternative embodiment of the invention.
Figure 3:
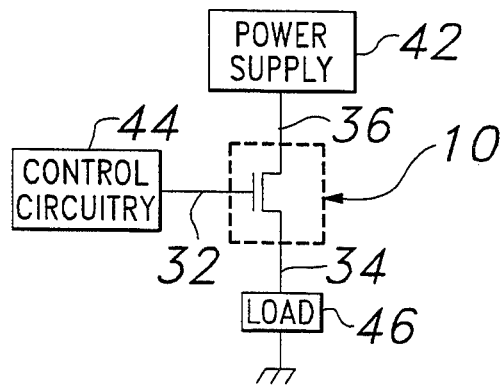
FIG. 3 is a block diagram illustrating a high side driver circuit configuration.

FIG. 2 is a cross section drawing illustrating an alternative embodiment of the invention. In this embodiment, the RESURF LDMOS transistor 10 has a drain interconnect 22a that extends over insulating layer 20b and forms a MOS gated drift region 22a. This alternative embodiment provides improved RDSon through the use of the MOS gated drift region 22a.

In FIG. 2 during a breakdown condition, the majority of the voltage drops across the drain drift region 14 thus causing the voltage drop across the MOS gated drift region 22a, channel 26, and source 22b to be approximately 5-10 volts. The existence of this voltage on the MOS gated drift region 22a creates a negative voltage on the MOS gated drift region 22a relative to the voltage in the drain drift region 14 and therefore makes the MOS gated drift region 22a, which lies over the first insulating layer 20b, operate as a field plate, thus pushing electrons in the drain drift region 14 down toward the substrate 12. This causes the drain drift region 14 to deplete in two directions, from the substrate 12—drain drift region 14 junction up towards the insulating layer 20b and form the drain drift region 14—insulating layer 20b junction down towards the substrate 12, This "top and bottom" dual depletion condition allows the drain drift region 14 to be doped more heavily during processing to further improve RDSon performance. RDSon is reduced when the transistor 10 is operating in the "on" mode.

The insulating layer 20b formed over the drain drift region 14 has a minimum thickness dictated by the breakdown voltage required by the design application. This is required because the voltage drop across the insulating layer 20b near the drain contact diffusion 16 will approximate the breakdown voltage. As applications require an increased breakdown voltage the insulating layer 20b thickness over the drain drift region 14 must also increase to prevent the insulating layer 20b form breaking down.

Although the invention has been described with reference to the preferred embodiment herein, this description is not to be construed in a limiting sense. Various modifications of the disclosed embodiment, such as modifications to drain drift region 14 length, depth or doping concentration, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A high voltage power transistor, comprising:
   a lateral semiconductor-on-insulator, SOI, transistor; and
   a bulk semiconductor drain drift region connected to the SOI transistor.

2. The high voltage power transistor of claim 1 wherein the SOI transistor comprises:
   a substrate of semiconductor material;
   an insulating layer overlying the substrate;
   a semiconductor layer, overlying the insulating layer, having three sections, one section forming a source for both the SOI transistor and the high voltage power transistor, a second section forming a channel, and a third section forming a drain;
   a second insulating layer overlying the channel section of the semiconductor layer; and
   a patterned conductive layer overlying the second insulating layer on top of the channel section of the semiconductor layer, forming a gate electrode for both the SOI transistor and the high voltage power transistor.

3. The SOI transistor of claim 2 wherein the substrate and semiconductor layer are single crystal silicon.

4. The SOI transistor of claim 2 wherein the substrate is single crystal silicon and the semiconductor layer is polycrystalline silicon.

5. The SOI transistor of claim 2 wherein the insulating layer overlying the substrate and the insulating layer overlying the second section of the semiconductor layer is composed of silicon dioxide, silicon nitride, or a combination of silicon dioxide and silicon nitride.

6. A high voltage power transistor, comprising:
   a semiconductor-on-insulator, SOI, transistor; and a bulk semiconductor drain drift region connected to the SOI transistor, wherein said SOI transistor further comprises:
- a substrate of P-type semiconductor material; an insulating layer overlying the substrate; a semiconductor layer, overlying the insulating layer, having three sections, one section of N+ type semiconductor material forming a source for both the SOI transistor and the high voltage power transistor, a second section of either N type or P type semiconductor material forming a channel, and a third section of N+ type semiconductor material forming a drain; a second insulating layer overlying the channel section of the semiconductor layer; and
- a patterned conductive layer overlying the second insulating layer on top of the channel section of the semiconductor layer, forming a gate electrode for both the SOI transistor and the high voltage power transistor.

7. A high voltage power transistor, comprising:
a semiconductor-on-insulator, SOI, transistor; and
a bulk semiconductor drain drift region connected to the SOI transistor, said drain drift region further comprising:
- a substrate of semiconductor material;
- a diffusion in the substrate whereby a drift region is formed;
- a first diffusion, inside the drift region, of higher doping concentration than the drift region whereby a drain contact region is formed;
- a second diffusion, spaced from the first diffusion and inside the drift region, of higher doping concentration than the drift region whereby a drain drift region contact is formed;
- a patterned insulating layer overlying the drain drift region with openings for contact down to the first and second diffusions inside the drift region; and
- a patterned conductive layer making electrical contact to both the second diffusion inside the drift region and to a drain of the SOI transistor.

8. The drain drift region of claim 7 wherein the substrate is P type semiconductor material, the drift region is N type semiconductor material, and both first and second diffusions inside the drift region are N+ type semiconductor material.

9. The drain drift region of claim 8 wherein the P type substrate doping concentration and the N type drift region depth and doping profile are designed according to RESURF design principles such that the drift region fully depletes at or before rated breakdown voltage of the high voltage power transistor.

10. A high voltage power transistor, comprising:
a semiconductor-on-insulator, SOI, transistor; and
a bulk semiconductor drain drift region connected to the SOI transistor, said drain drift region further comprising:
- a substrate of semiconductor material;
- a diffusion in the substrate whereby a drift region is formed;
- a first diffusion, inside the drift region, of higher doping concentration than the drift region whereby a drain contact region is formed;
- a second diffusion, spaced from the first diffusion and inside the drift region, of higher doping concentration than the drift region whereby a drain drift region contact is formed;
- a patterned insulating layer overlying the drain drift region with openings for contact down to the first and second diffusions inside the drift region; and
- a patterned conductive layer overlying the patterned insulating layer having two sections, one section making electrical contact to both the second diffusion inside the drift region and to a drain of the SOI transistor, and a second section lying between the first and second diffusions inside the drift region whereby a field plate is formed.

11. The drain drift region of claim 10 wherein the substrate is P type semiconductor material, the drift region is N type semiconductor material, and the first and second diffusions inside the drift region are N+ type semiconductor material.

12. The drain drift region of claim 10 wherein the conductive layer is electrically connected to either source, gate, or drain terminal of the SOI transistor, or is held at a potential below that of the drain terminal of the high voltage power device.

13. The drain drift region of claim 10 wherein the P type substrate doping concentration and the N type drift region depth and doping profile are designed according to RESURF design principles such that the drift region fully depletes at or before rated breakdown voltage of the high voltage power transistor.

14. A high voltage power transistor with electrical isolation between source and substrate, comprising:
- a drain drift region formed in a semiconductor substrate having a drain contact and an interconnect contact; and
- a lateral SOI MOS transistor formed on an insulating layer overlying the substrate, having a source contact, a gate contact, and a drain interconnect connected to the interconnect contact of the drain drift region.

15. A high side driver configuration with a high voltage power transistor having its source isolated from the substrate, comprising:
- a drain drift region formed in a semiconductor substrate having a drain contact and an interconnect contact with the drain contact connected to a power supply; and
- a lateral SOI MOS transistor having a source contact, a gate contact, and a drain interconnect with the source contact connected to a load, the gate contact connected to control circuitry, and the drain interconnect connected to the interconnect contact of the drain drift region.

* * * * *